United States Patent [19]

Shankar et al.

[11] Patent Number: 4,764,225

[45] Date of Patent: Aug. 16, 1988

[54] ALLOYS FOR HIGH TEMPERATURE APPLICATIONS

[75] Inventors: Srinivasan Shankar; Louis E. Dardi, both of Muskegon, Mich.

[73] Assignee: Howmet Corporation, Greenwich, Conn.

[21] Appl. No.: 149,499

[22] Filed: May 13, 1980

Related U.S. Application Data

[63] Continuation-in-part of Ser. No. 67,097, Aug. 16, 1979, which is a continuation-in-part of Ser. No. 43,146, May 29, 1979.

[51] Int. Cl.$^4$ ............................................. C22C 19/05
[52] U.S. Cl. ................................... 148/404; 148/410; 148/419; 148/428; 148/442
[58] Field of Search ..................... 75/170, 171; 148/32, 148/32.5

[56] References Cited

U.S. PATENT DOCUMENTS

| | | | |
|---|---|---|---|
| 3,494,709 | 2/1970 | Piearcey | 75/171 |
| 3,723,107 | 3/1973 | Richards et al. | 75/171 |
| 3,802,934 | 4/1974 | Augustine et al. | 148/32.5 |
| 4,080,202 | 3/1978 | Fukui et al. | 148/32.5 |
| 4,219,592 | 8/1980 | Anderson et al. | 75/170 |
| 4,569,824 | 2/1986 | Duhl et al. | 148/404 |

FOREIGN PATENT DOCUMENTS

| | | |
|---|---|---|
| 56 | 1/1972 | Japan . |
| 117626 | 9/1975 | Japan . |

OTHER PUBLICATIONS

Nguyen-Dinh et al., Fourth Quarterly Report, Nov. 10, 1979.

*Primary Examiner*—R. Dean
*Attorney, Agent, or Firm*—Finnegan, Henderson, Farabow, Garrett & Dunner

[57] ABSTRACT

A nickel- or cobalt-based alloy of the type containing, by weight, 5 to 40% chromium, up to about 10% aluminum, up to about 10% titanium, up to about 30%, in combination, of elements from the group tantalum, tungsten, molybdenum, columbium, rhenium, or vanadium, up to about 2% silicon, up to about 5% hafnium, and up to about 5% reactive elements such as lanthanum, yttrium or other rare earths. Manganese is present in an amount from 0.1 to 12%, preferably 0.5 to 4%. Silicon in amounts from 1.0 to 2.0 by weight, or hafnium in amounts from 0.1 to 5.0% by weight may also be used. Alloys in accordance with this invention are particularly suitable for casting by the single crystal technique; however, the alloys can also be used in the production of polycrystalline components such as directionally solidified, conventionally solidified (equiaxed), wrought, or dispersion strengthened materials. In the latter case, grain boundary modifiers such as carbon, boron, zirconium and hafnium are utilized. The alloys produced are advantageously used as structural alloys for use in gas turbine rotor blades and stator vanes which require high temperature strength, high temperature ductility, oxidation and hot corrosion resistance, and microstructural stability.

18 Claims, No Drawings

ALLOYS FOR HIGH TEMPERATURE APPLICATIONS

RELATED APPLICATIONS

This application is a continuation-in-part of applicants' copending application Ser. No. 067,097, filed on Aug. 16, 1979 and entitled "Superalloy Coating Composition", which application is a continuation-in-part of applicants' copending application Ser. No. 043,146, filed May 29, 1979 and entitled "High Temperature Oxidation and Sulfidation Resistant Coating".

BACKGROUND OF THE INVENTION

This invention relates to superalloy compositions particularly suited for producing parts to be employed for high temperature applications. The compositions can be effectively produced utilizing single crystal casting techniques and can also be utilized for the production of polycrystalline components such as directionally solidified, conventionally solidified (equiaxed), wrought or dispersion strengthened materials.

It is well known that metal articles are exposed to extreme temperatures in certain applications such as in gas turbine engines. When used for such applications, the articles must have good strength and ductility at the high temperatures, and they must exhibit suitable surface stability in view of the corrosive conditions encountered. Desired characteristics also include metallurgical stability and ease of casting.

Alloy compositions typically used for such applications are not particularly susceptible to the addition of elements which are beneficial to surface stability. Such elements may have a tendency to weaken grain boundaries and, therefore, the improvements in surface stability result in a loss of strength at elevated temperatures. Where elements such as boron, carbon or hafnium are introduced to modify grain boundaries, the elements can be detrimental to surface stability and, therefore, a loss of some properties to achieve an improvement in others is also realized in those cases. Finally, random orientation of grain boundaries in prior alloys has been recognized, and this results in grain boundary "slide" and "creep" at elevated temperatures.

The conventional casting alloys referred to which will achieve suitable performance at a certain temperature limit include, for example, an alloy of the following composition designated B-1900+Hf; Cr-8%; Co-10%, Al-6%, Ti-1%, Ta-4.3%, Cb<0.1%, Hf-1.1%, C-0.1%, Zr<0.13%; B-0.015%, Fe<0.35%, Mn<0.2%, Si<0.2%, Mo-6%, Ni-balance.

The grain boundary sliding phenomenon usually occurs at the "transverse" grain boundaries (boundaries transverse to the stress direction) and can be eliminated by removing these boundaries in the alloy. Such a casting approach is called directional solidification (D.S.) wherein grains are made to grow in a preferred orientation parallel to the direction of heat flow. Although these alloys possess better creep strength and thermal shock resistance than the conventionally cast alloys, they still have grain boundaries which control the type of alloying elements that can be added to enhance the useful life of the alloy. An example of a nickel-base D.S. alloy is Mar-M200+Hf which has the following composition: Cr-9%, Co-10%, Al-5%, Ti-2%, Cb-1%, W-12%, Hf-2%, C-0.14%, Zr-0.05%, B-0.02%, Ni-balance. It is seen that most of the grain boundary modifiers are still needed for this alloy.

The above mentioned grain boundary modifiers can be removed using a single crystal casting approach in which there are no grain boundaries. Alloys proposed for this approach generally possess superior creep resistance and high temperature strength when compared with conventionally cast or directionally solidified alloys. This beneficial attribute makes it desirable to use these alloys for very high temperature (2000° F.) applications. There is, however, still that problem of surface stability at these high temperatures, the primary modes of surface attack being oxidation and thermal fatigue and to a lesser extent, sulfidation. An example of a single crystal alloy, currently in use, is Monoloy 454 with the following composition: Cr-10%, Co-5%, Al-5%, Ti-1.5%, Ta-12%, W-4%, and Ni-balance.

SUMMARY OF THE INVENTION

The primary purpose of this invention is the provision of improved high temperature alloys, particularly single crystal alloys, characterized by superior oxidation and sulfidation resistance and substantially free of detrimental properties. This application contemplates the addition of alloying elements to improve surface stability, which in the case of single crystal structural alloys is facilitated by the absence of grain boundaries. As indicated, the compositions of this invention substantially correspond with the coating compositions described in applicants' copending applications Ser. Nos. 043,146 and 067,097. The subject coatings demonstrate excellent environmental stability (oxidation and sulfidation resistance) and, in addition, exhibit high ductility and good resistance to cyclic stress. This excellent performance is achieved despite the relatively high aluminum content of the compositions (by structural alloy standards) and despite the absence of grain boundary modifiers in the polycrystalline coating compositions. These results imply that the coating compositions can be used to form the basis of an improved class of high temperature structural alloys. In this case, however, compositional variations are contemplated that would achieve a balance of properties that is more compatible with use as a structural material.

Where nickel-base alloys are considered, for example, the aluminum levels of the aforementioned coatings would be reduced somewhat, so that the primary nickel-aluminum compound formed in the material is $Ni_3Al$ (gamma prime), a coherent strengthening phase for nickel-base alloys, rather than NiAl (beta), a more oxidation resistant compound that is ineffective as a strengthener. Where cobalt-base alloys are considered, considerably lower aluminum levels (less than 1 percent by weight) generally would be used, since no useful coherent cobalt-aluminum strengthening compound forms in this system. Furthermore, regardless of the base alloy (nickel or cobalt), modest additions of solid solution strengthening elements, such as tungsten, molybdenum, tantalum, columbium, rhenium, vanadium or combinations thereof, are desirable to improve resistance to elevated temperature deformation. Although potentially useful as coating compositions, iron base alloys are not contemplated as high temperature structural materials, since they are known to be considerably weaker than nickel or cobalt base alloys.

By suitably modifying the composition within the ranges specified by this invention, the alloys may also be made suitable for use in the production of polycrystalline components as in the base of directionally solidified, conventionally solidified or (equiaxed) wrought or dispersion strengthened materials. In the last mentioned casting technique, as is well known, metals or alloys are strengthened by chemically inert dispersions such as oxide particles.

The alloy compositions of this invention possess very good elevated temperature creep and rupture properties, oxidation and sulfidation resistance, thermal fatigue strength, and microstructural stability, and are well suited for the single crystal casting technique. The alloys nickel- or cobalt-based alloys of the type containing, by weight, 5 to 40% chromium, up to about 10% aluminum, up to about 10% titanium, up to about 30%, in combination, of elements from the group tantalum, tungsten, molybdenum, columbium, rhenium, or vanadium, up to about 2% silicon, up to about 5% hafnium, and up to about 5% reactive elements such as lanthanum, yttrium or other rare earths. Manganese is present in an amount from 0.1 to 12%, preferably 0.5 to 4%.

Alloys in accordance with this invention are particularly suitable for casting by the single crystal technique, however, as noted, the alloys can also be used in the production of polycrystalline components. In that case, grain boundary modifiers are employed including by weight, carbon in amounts up to 3.0%, boron up to 2.0% and zirconium up to 1.0%. Hafnium is also utilized as a grain boundary modifier in a well-known fashion.

The alloys produced are advantageously used as structural alloys for use in gas turbine rotor blades and stator vanes which require high temperature strength, good ductility, oxidation and hot corrosion resistance, and microstructural stability. The alloys are also expected to possess excellent thermal and mechanical fatigue properties.

DESCRIPTION OF PREFERRED EMBODIMENTS

In the alloys of this invention earlier described, additions to the nickel- or cobalt-based alloys are adjusted to satisfy the requirements of microstructural stability, and to prevent the formation of the deleterious sigma phase or other TCP phases. As a general proposition, nickel-base alloys are formulated to contain cobalt in amounts up to 15% by weight, and preferably from about 5 to about 10% by weight, and amounts of iron less than about 1% by weight. Cobalt-base alloys contain nickel up to about 20% by weight and preferably from about 5 to about 10% with iron being present in an amount less than 1% by weight.

In formulating alloy compositions for use as single crystal nickel-base alloys, preferred compositions are found within the ranges 5 to 10 weight percent cobalt, 8 to 16 weight percent chromium, 3 to 7 weight percent aluminum, 1 to 3 weight percent titanium, 5 to 8 weight percent aluminum plus titanium, 3 to 10 weight percent of a member from the group consisting of tungsten, molybdenum, tantalum, columbium, rhenium and vanadium or combinations thereof, 0.1 to 3 weight percent manganese, up to 1 weight percent silicon, up to 3 weight percent hafnium and up to about 5 weight percent reactive metals such as lanthanum, yttrium or other rare earths.

Aluminum and titanium are included in these alloys in amounts and mutual proportions to precipitate high volume fractions of face-centered cubic $\gamma'$ which precipitates coherently with the $\gamma$(Ni) austenite matrix. This $\gamma'$ phase is responsible for the high temperature strength in these alloys. This phase is of the $A_3B$ type with the A consisting of relatively electronegative elements such as nickel, cobalt or iron and the B consisting of more electropositive elements like aluminum, titanium, or columbium. Moreover, aluminum, if added in sufficient amounts, can cause the formation of a thin adherent film of $Al_2O_3$ on these alloys. This film provides oxidation resistance in high temperature environments. Cobalt, iron, aluminum and titanium can also be dissolved in the $\gamma$(Ni) matrix in addition to chromium, molybdenum, tantalum, tungsten, and vanadium. Such a partitioning results in solid-solution strengthening.

It is well known to those skilled in the art that aluminum, tungsten, molybdenum and chromium serve as strong solid-solution strengtheners while iron, titanium, cobalt and vanadium serve only as weak solid-solution strengtheners. It is also well known that the addition of chromium also improves the hot corrosion (sulfidation) resistance of the alloy. Co-pending applications, Ser. Nos. 043,146 and 067,097, teach that the addition of tantalum and manganese combinations improve oxidation resistance, and copending application Ser. No. 145,460 teaches that manganese additions impart sulfidation resistance.

In addition to the elements mentioned above, the alloys contemplated in this application will include manganese and may include hafnium, silicon and reactive metals such as lanthanum, yttrium or other rare earths. The current application utilizes the potent ability of manganese to improve the hot corrosion (sulfidation) resistance of nickel- and cobalt-base alloys. The application also utilizes the effects of hafnium, silicon and reactive metals such as lanthanum, yttrium or other rare earths to further improve the environmental resistance of nickel- or cobalt-base alloys. The preferred ranges of these elements for the cobalt-base single crystal alloys generally will be the same as for the single crystal nickel-base alloy. As mentioned earlier where the alloys are used in the production of polycrystalline components, grain boundary modifiers like carbon, boron and zirconium will be added in prescribed amounts.

The following table illustrates the compositions conforming to this patent application that are contemplated:

| TYPE | CODE | FORM | ALLOYS CONTAINING MANGANESE | | | | | | | | | |
| --- | --- | --- | --- | --- | --- | --- | --- | --- | --- | --- | --- | --- |
| | | | Ni | Co | Cr | Al | Ti | Ta | W | Mo | Cb | Mn | OTHER |
| Nickel-Based | #1 | Single Crystal | Bal | 5 | 10 | 5 | 2 | 3 | 9 | | | 2.5 | |
| " | #2 | Single Crystal | Bal | 5 | 10 | 5 | 2 | 3 | 9 | | | 2.5 | La = 0.5 |
| " | #3 | Single Crystal | Bal | 5 | 10 | 5 | 2 | 3 | 9 | | | 1.0 | Si = 1.5 |
| " | #4 | Single Crystal | Bal | 5 | 10 | 5 | 2 | 3 | 9 | | | 1.0 | Si = 1.5, La = 0.5 |
| " | #5 | Single Crystal | Bal | 8 | 10 | 6 | 1 | 5 | 6 | 1 | | 2.0 | |

-continued

| TYPE | CODE | FORM | ALLOYS CONTAINING MANGANESE | | | | | | | | | | |
| --- | --- | --- | --- | --- | --- | --- | --- | --- | --- | --- | --- | --- | --- |
| | | | Ni | Co | Cr | Al | Ti | Ta | W | Mo | Cb | Mn | OTHER |
| " | #6 | Single Crystal | Bal | 10 | 9 | 6 | 1 | 8 | 5 | 1 | | 0.5 | |
| " | #7 | Poly Crystal | Bal | 10 | 14 | 4 | 3 | | | 8 | | 2.0 | C = 0.1, B = 0.01 |
| " | #8 | Poly Crystal | Bal | | 14 | 6 | 1 | | | 5 | 2 | 1.5 | C = 0.1, B = 0.01, Zr = 0.08 |
| " | #9 | Poly Crystal | Bal | | 19 | 0.5 | 0.9 | | | 3 | 5 | 1.0 | C = 0.05, B = 0.006 |
| " | #10 | Poly Crystal | Bal | 7 | 9 | 6 | 1 | 3 | 5 | 1.8 | | 2.5 | C = 0.08, B = 0.01, Zr = 0.02 |
| " | #11 | Poly Crystal | Bal | 7 | 9 | 6 | 1 | 4 | 6 | 1.8 | | 2.0 | C = 0.08, B = 0.01, Zr = 0.02 |
| " | #12 | Poly Crystal | Bal | 5 | 6 | 7 | 1 | 2.5 | 4 | 11 | | 2.5 | C = 0.08, B = 0.01, Zr = 0.02 |
| " | #13 | Poly Crystal | Bal | 7 | 9 | 7 | 1 | 3.0 | 5 | 9.5 | | 2.5 | C = 0.08, B = 0.01, Zr = 0.02 |
| Cobalt-Based | #14 | Single Crystal | 10 | Bal | 21 | | | 3.5 | 8 | | | 1.0 | |
| " | #15 | Single Crystal | 10 | Bal | 25 | | | | 8 | | | 1.5 | Hf = 0.5 |
| " | #16 | Poly Crystal | 10 | Bal | 21 | | | 3.5 | 8 | | | 1.0 | C = 0.4, B = 0.01, Zr = 0.3 |

It will be understood that various changes and modifications not specifically referred to herein may be made in the invention described without departing from the spirit of the invention particularly as defined in the following claims.

We claim:

1. A single crystal nickel-based alloy consisting essentially of, by weight, 5 to 40% chromium, 0.5 to 12% manganese, 3 to 10% aluminum, 0 to 10% titanium, at least 5% aluminum plus titanium, up to about 15% cobalt, up to about 30%, in combination, of a member from the group consisting of tantalum, tungsten, molybdenum, columbium, rhenium, or vanadium, up to about 2% silicon, up to about 5% hafnium, and balance nickel;
  in which the ratio of aluminum:titanium exceeds 1, said alloy forming protective aluminum-rich surface oxides and being resistant to oxidation and corrosion.

2. An alloy according to claim 1 wherein the manganese is present from about 0.5 to about 4% by weight.

3. An alloy according to claim 1 containing less than about 1% by weight iron.

4. An alloy according to claim 3 containing 5 to 10 weight percent cobalt, 8 to 16 weight percent chromium, 3 to 10 weight percent of a member from the group consisting of tungsten, tantalum, molybdenum, columbium, rhenium, and vanadium, and combinations thereof, 0.5 to 3 weight percent manganese, up to 1 weight percent silicon, up to 3 weight percent hafnium, and up to about 5 percent reactive metals selected from yttrium, lanthanum, and other rare earth metals.

5. An alloy according to claim 1 containing up to about 5% by weight of a reactive metal selected from the rare earth metals.

6. A gas turbine engine component formed from the single crystal alloy of claim 1.

7. A gas turbine engine component of a polycrystalline nickel-based alloy containing grain boundary modifiers comprising a matrix consisting essentially of, by weight, 5 to 40% chromium, 0.5 to 12% manganese, up to about 15% cobalt, 3 to 10% aluminum, less than about 1% iron, 0 to 10% titanium, at least 5% aluminum plus titanium, up to about 30%, in combination, of a member from the group consisting of tantalum, tungsten, molybdenum, columbium, rhenium, and vanadium, up to about 2% silicon, up to about 5% hafnium, up to 30% by weight dispersion strengthening oxides present in said matrix, and balance nickel;
  in which the ratio of aluminum:titanium exceeds 1, said alloy forming protective aluminum-rich surface oxides and being resistant to oxidation and corrosion.

8. A component according to claim 7 containing up to about 5% by weight of a reactive metal selected from the rare earth metals.

9. A component according to claim 7 including from about 5 to about 10% cobalt.

10. A component according to claim 7 wherein said alloy comprises a directionally solidified material.

11. A component according to claim 7, wherein the manganese is present from about 0.5 to about 4% by weight.

12. A directionally solidified nickel-based alloy containing grain boundary modifiers comprising a matrix consisting essentially of by weight, 5 to 40% chromium, 0.5 to 12% manganese, up to about 15% cobalt, 3 to 10% aluminum, less than about 1% iron, 0 to 10% titanium, at least 5% aluminum plus titanium, up to about 30%, in combination of a member from the group consisting of tantalum, tungsten, molybdenum, columbium, rhenium, and vanadium, up to about 2% silicon, up to about 5% hafnium, up to 30% by weight dispersion strengthening oxides present in said matrix, and balance nickel;
  in which the ratio of aluminum:titanium exceeds 1, said alloy forming protective aluminum-rich surface oxides and being resistant to oxidation and corrosion.

13. An alloy according to claim 12 containing up to about 5% by weight of a reactive metal selected from the rare earth metals.

14. An alloy according to claim 12 including from about 5 to about 10% cobalt.

15. An alloy according to claim 12 wherein the manganese is present from about 0.5 to about 4% by weight.

16. An alloy according to claim 1, wherein the aluminum is present from 3 to 7%, the titanium is present from 1 to 3%, and aluminum plus titanium is present from 5 to 8% by weight.

17. An alloy according to claim 12, wherein the aluminum is present from 3 to 7%, the titanium is present from 1 to 3%, and aluminum plus titanium is present from 5 to 8% by weight.

18. A component according to claim 7, wherein the aluminum is present from 3 to 7%, the titanium is present from 1 to 3%, and aluminum plus titanium is present from 5 to 8% by weight.

* * * * *